US009524849B2

(12) United States Patent
Graff et al.

(10) Patent No.: US 9,524,849 B2
(45) Date of Patent: Dec. 20, 2016

(54) METHOD OF IMPROVING ION BEAM QUALITY IN AN IMPLANT SYSTEM

(71) Applicant: Varian Semiconductor Equipment Associates, Inc., Gloucester, MA (US)

(72) Inventors: John W. Graff, Swampscott, MA (US); Bon-Woong Koo, Andover, MA (US); John A. Frontiero, Rockport, MA (US); Nicholas PT Bateman, Reading, MA (US); Timothy J. Miller, Ipswich, MA (US); Vikram M. Bhosle, North Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/089,916

(22) Filed: Nov. 26, 2013

(65) Prior Publication Data

US 2015/0024579 A1    Jan. 22, 2015

Related U.S. Application Data

(60) Provisional application No. 61/847,776, filed on Jul. 18, 2013.

(51) Int. Cl.
    *H01L 21/425*   (2006.01)
    *H01J 37/08*    (2006.01)
    *H01J 37/317*   (2006.01)

(52) U.S. Cl.
    CPC ............ *H01J 37/08* (2013.01); *H01J 37/3171* (2013.01); *H01J 2237/006* (2013.01)

(58) Field of Classification Search
    CPC . H01L 21/265; H01J 37/3171; H01J 2237/006
    USPC .................................................. 438/514, 527
    See application file for complete search history.

(56) References Cited

U.S. PATENT DOCUMENTS

| | | | |
|---|---|---|---|
| 4,533,831 | A | 8/1985 | Itoh et al. |
| 7,655,931 | B2 | 2/2010 | Gupta |
| 2005/0098742 | A1 | 5/2005 | Kellerman et al. |
| 2008/0237496 | A1 | 10/2008 | Gupta |
| 2008/0248636 | A1* | 10/2008 | Olander et al. ............... 438/515 |
| 2009/0200460 | A1 | 8/2009 | Chaney et al. |
| 2012/0142174 | A1 | 6/2012 | Kaim et al. |
| 2013/0260544 | A1* | 10/2013 | Koo ....................... C23C 14/48 438/527 |

OTHER PUBLICATIONS

International Search Report and Written Opinion Mailed Nov. 28, 2014 for PCT/US2014/047103 Filed Jul. 17, 2014.

* cited by examiner

*Primary Examiner* — Bradley K Smith
(74) *Attorney, Agent, or Firm* — Nields, Lemack & Frame, LLC

(57) ABSTRACT

A method for improving the ion beam quality in an ion implanter is disclosed. In some ion implantation systems, contaminants from the ion source are extracted with the desired ions, introducing contaminants to the workpiece. These contaminants may be impurities in the ion source chamber. This problem is exacerbated when mass analysis of the extracted ion beam is not performed, and is further exaggerated when the desired feedgas includes a halogen. The introduction of a diluent gas in the ion chamber may reduce the deleterious effects of the halogen on the inner surfaces of the chamber, reducing contaminants in the extracted ion beam. In some embodiments, the diluent gas may be germane or silane.

11 Claims, 4 Drawing Sheets

METHOD OF IMPROVING ION BEAM QUALITY IN AN IMPLANT SYSTEM

This application claims priority of U.S. Provisional Patent Application Ser. No. 61/847,776, filed Jul. 18, 2013, the disclosure of which is incorporated by reference.

FIELD

Embodiments of the present disclosure relate to methods for improving ion beam quality in an ion implantation system, and more particularly, improving boron ion beam quality.

BACKGROUND

Semiconductor workpieces are often implanted with dopant species to create a desired conductivity. For example, solar cells may be implanted with a dopant species to create an emitter region. This implant may be done using a variety of different mechanisms. In one embodiment, an ion source is used. This ion source may include a chamber in which source gasses are ionized. The ions from these source gasses may be extracted through an aperture in the chamber, using one or more electrodes. These extracted ions are directed toward a workpiece, where they are implanted in the workpiece to form the solar cell.

In an effort to improve process efficiency and lower cost, in some embodiments, the ions extracted from the ion source are accelerated directly toward the workpiece, without any mass analysis. In other words, the ions that are generated in the ion source are accelerated and implanted directly into the workpiece. A mass analyzer is used to remove undesired species from the ion beam. Removal of the mass analyzer implies that all ions extracted from the ion source will be implanted in the workpiece. Consequently, undesired ions, which may also be generated within the ion source, are then implanted in the workpiece.

This phenomenon may be most pronounced when the source gas is a halogen-based compound, such as a fluoride. Fluorine ions and neutrals (metastable or excited) may react with the inner surfaces of the ion source, releasing unwanted ions, such as silicon, oxygen, carbon, and aluminum and heavy metals present as impurity elements.

Therefore, a method which improves beam quality, particular for embodiments in which halogen based source gasses are employed, would be beneficial.

SUMMARY

A method for improving the ion beam quality in an ion implanter is disclosed. In some ion implantation systems, contaminants from the ion source are extracted with the desired ions, introducing contaminants to the workpiece. These contaminants may be impurities in the ion source chamber. This problem is exacerbated when mass analysis of the extracted ion beam is not performed, and is further exaggerated when the desired feedgas includes a halogen. The introduction of a diluent gas in the ion chamber may reduce the deleterious effects of the halogen on the inner surfaces of the chamber, reducing contaminants in the extracted ion beam. In some embodiments, the diluent gas may be germane or silane.

In one embodiment, a method of implanting dopant into a workpiece is disclosed. The method comprises introducing a feedgas and a diluent gas into a chamber of an ion source, the feedgas comprising molecules comprising a dopant and fluoride, wherein the dopant comprises a Group 3 or Group 5 element, and the diluent gas comprises molecules comprising hydrogen and a Group 4 element or molecules comprising hydrogen and a species having an opposite conductivity as the dopant, where between 3% and 40% of a total volume of gas introduced comprises the diluent gas and a remainder of the total volume comprises the feedgas; ionizing the feedgas and the diluent gas in the chamber; and extracting ions from the chamber and accelerating the ions toward the workpiece.

In another embodiment, a method of implanting boron into a workpiece is disclosed. The method comprises introducing a feedgas and a diluent gas into a chamber of an ion source, the feedgas comprising molecules containing boron and fluorine, the diluent gas comprising molecules containing hydrogen and a Group V, where between 3% and 20% of a total volume of gas introduced comprises diluent gas and a remainder of the total volume comprises feedgas; ionizing the feedgas and the diluent gas in the chamber; and extracting ions from the chamber and accelerating the ions toward the workpiece, wherein the extracted ions are not mass analyzed before implanting into the workpiece.

In another embodiment, a method of implanting boron into a workpiece is disclosed. The method comprises introducing a feedgas and a diluent gas into a chamber of an ion source, the feedgas comprising molecules containing boron and fluorine, the diluent gas comprising molecules containing hydrogen and germanium, where between 10% and 20% of a total volume of gas introduced comprises diluent gas and a remainder of the total volume comprises feedgas; ionizing the feedgas and the diluent gas in the chamber; and extracting ions from the chamber and accelerating the ions toward the workpiece, wherein the extracted ions are not mass analyzed before implanting into the workpiece.

BRIEF DESCRIPTION OF THE FIGURES

For a better understanding of the present disclosure, reference is made to the accompanying drawings, which are incorporated herein by reference and in which.

DETAILED DESCRIPTION

As described above, ionization of halogen-based species, such as fluorides, may cause particles released from the inner surfaces of the ion source to be implanted in the workpiece. These contaminants may include aluminum, carbon, oxygen, silicon, fluorine-based compounds, and other unwanted species (including heavy metals present as impurity elements). One approach to address the damage caused by free halogen ions may be to introduce a second source gas.

Figure 1A:
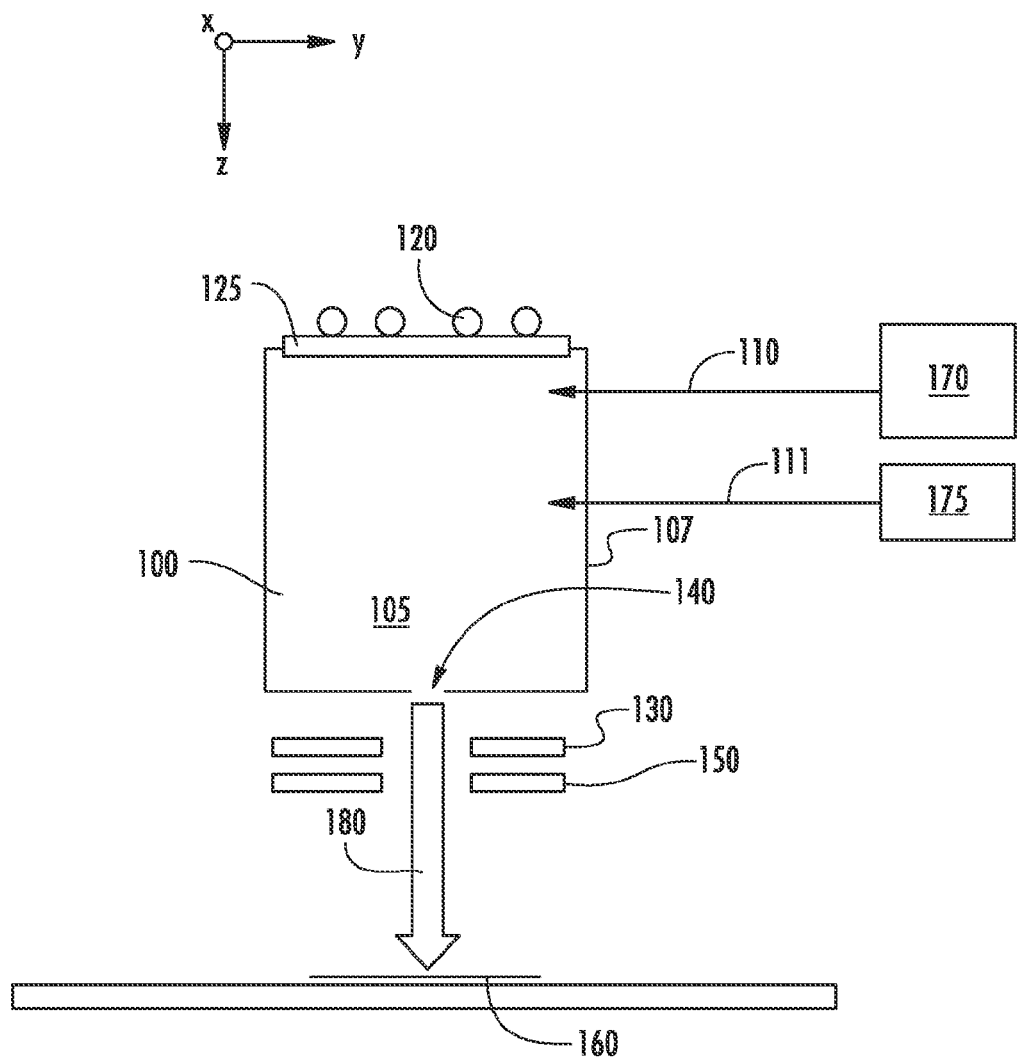
FIGS. 1A-C show the implant system according to different embodiments.
Figure 1B:
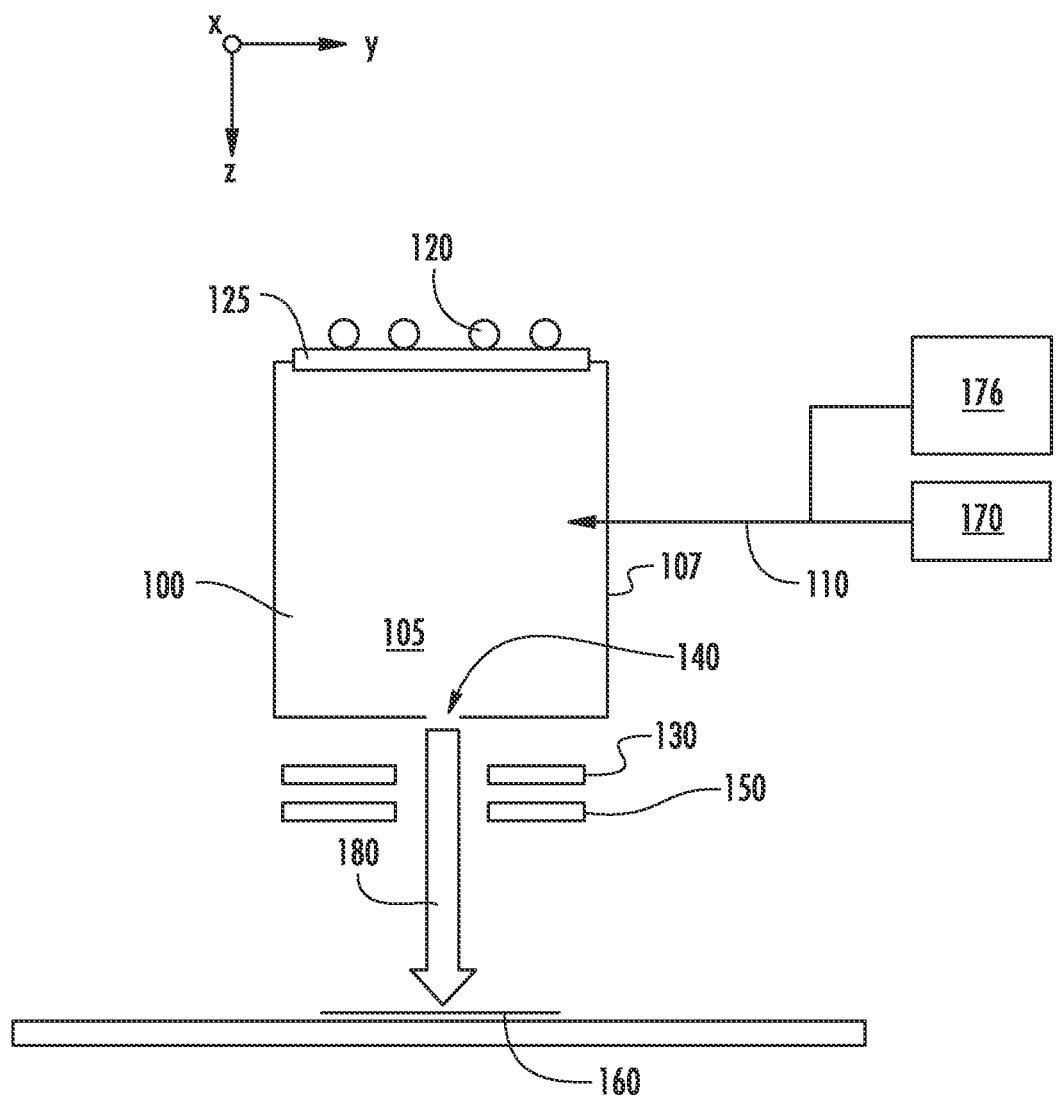
Figure 1C:
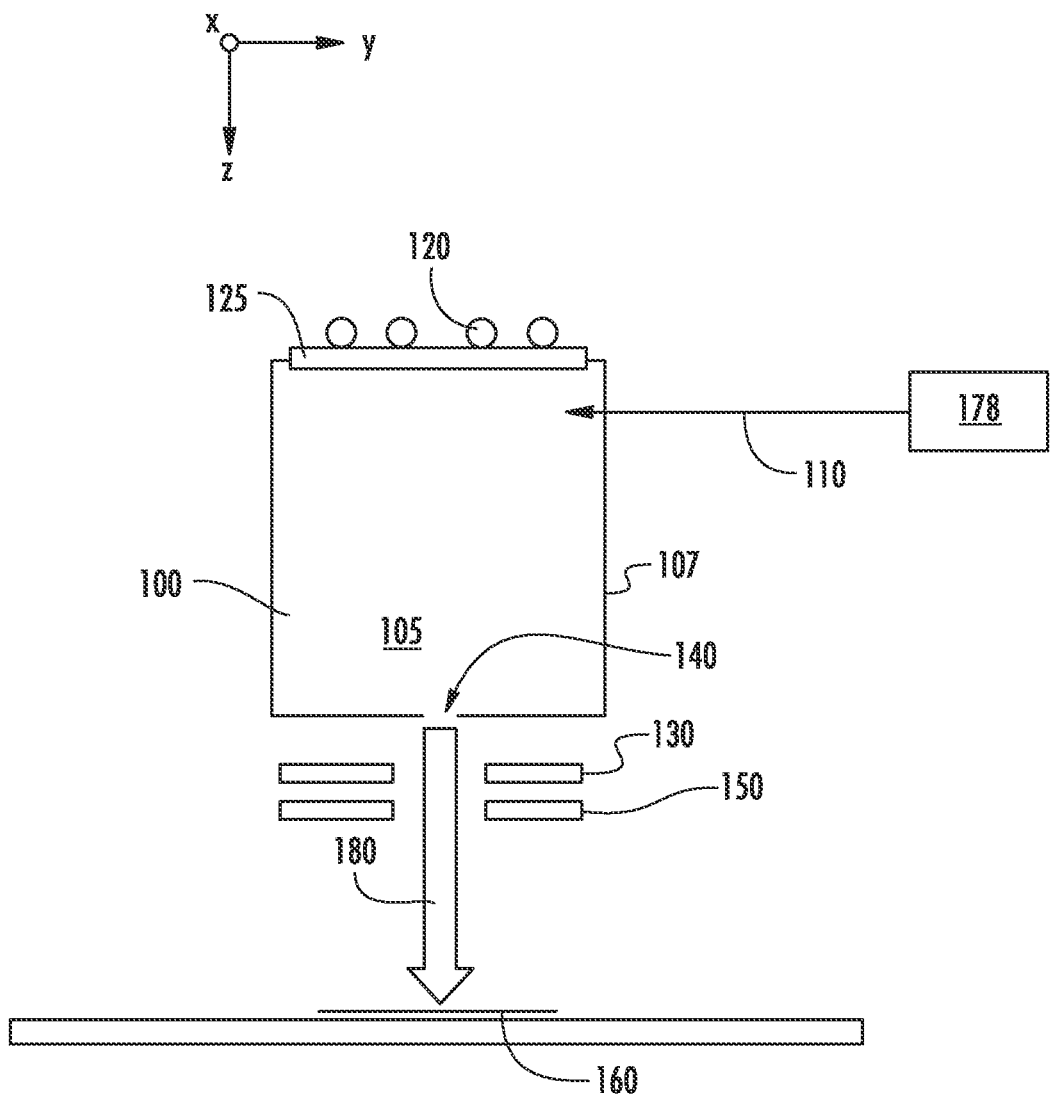

FIGS. 1A-1C show various embodiments in which a second source gas may be introduced to a chamber 105 of an ion source 100. In each of these figures, the ion source 100 includes a chamber 105 defined by several walls 107, which may be constructed from graphite or another suitable material. This chamber 105 may be supplied with one or more source gasses, stored in a source gas container 170, via a gas inlet 110. This source gas may be energized by an RF antenna 120 or another mechanism. The RF antenna 120 is in electrical communication with a RF power supply (not shown) which supplies power to the RF antenna 120. A dielectric window 125, such as a quartz or alumina window, may be disposed between the RF antenna 120 and the interior of the ion source 100. The ion source 100 also includes an aperture 140 through which ions may pass. A negative voltage is applied to extraction suppression electrode 130 disposed outside the aperture 140 to extract the positively charged ions from within the chamber 105 through the aperture 140 and toward the workpiece 160. A ground electrode 150 may also be employed. In some embodiments, the aperture 140 is located on the side of the ion source 100 opposite the side containing the dielectric window 125. Ions extracted from the chamber 105 are formed into an ion beam 180, which is directed toward the workpiece 160. As described above, no mass analyzer is used to filter the ions before they strike the workpiece 160. In one particular embodiment, shown in FIG. 1A, the second source gas may be stored in a second gas container 175 and introduced to the chamber 105 through a second gas inlet 111. In another embodiment, shown in FIG. 1B, the second source gas may be stored in a second gas container 176 and introduced to the chamber 105 through the same gas inlet 110 used by the first source gas. In yet another embodiment, shown in FIG. 1C, the second source gas may be mixed with the first source gas in a single gas container 178. This mixture of gasses is then introduced to the chamber 105 through gas inlet 110.

In any of these embodiments, the first source gas and the second source gas may be introduced simultaneously or sequentially to the chamber 105.

The first source gas, also referred to as the feed gas, may comprise a dopant, such as boron, in combination with fluorine. Thus, the feed gas may be in the form of $DF_n$ or $D_mF_n$, where D represents the dopant atom, which may be boron, gallium, phosphorus, arsenic or another Group 3 or Group 5 element. The second source gas, also referred to as the diluent gas, may be a molecule having a chemical formula of $XH_n$ or $X_mH_n$, where H is hydrogen. X may be a dopant species, such as any of those described above. Alternatively, X may also be an atom that does not affect conductivity of the workpiece 160. For example, if the workpiece 160 comprises silicon, X may be a Group 4 element, such as silicon and germanium.

In other words, the feedgas may be $BF_3$ or $B_2F_4$, while the diluent gas may be, for example, $PH_3$, $SiH_4$, $NH_3$, $GeH_4$, $B_2H_6$, or $AsH_3$. This list represents some possible species that may be used. It is understood that other feedgas species and diluent species are also possible.

By combining the feedgas with the diluent gas, the deleterious effects of the fluorine ions may be reduced. For example, without being limited to any particular theory, the introduction of hydrogen may create a film or coating on the dielectric window 125. This serves to protect the dielectric window 125, which reduces the amount of contaminants originating from the dielectric window 125 that are contained in the extracted ion beam 180. In addition, the diluent gas may coat the inner surfaces of the chamber walls 107, which may be another source of contaminants. This coating may reduce the interaction between fluorine ions and the inner surfaces of the chamber walls 107, reducing the amount of contaminants generated.

The introduction of a diluent gas may reduce the creation of contaminants and the incorporation of these contaminants in the ion beam. Conversely, the introduction of a large amount of diluent gas may negatively impact the production of dopant ions to be used in the ion beam. For example, the introduction of an excessive amount of diluent gas may reduce the dopant beam current created by the ion source.

Unexpectedly, it has been determined that contaminant reduction does not decrease proportionally with increased diluent concentration. In other words, if the amount of diluent is increased above a certain threshold, the ratio of contaminant current to dopant current actually increases. This may be caused by the fact that above a certain threshold, the additional coating on the inner surfaces of the chamber walls 107 provides little or no additional protection against fluorine ions. Additionally, plasma parameters, such as high plasma potential, will be changed with high diluent gas percentage, which may cause additional sputtering of the chamber walls 107 by diluent gas ions. The additional sputtering of the chamber walls 107 may cause increased contamination level. Thus, if the dopant current decreases as a function of diluent concentration, and contaminant concentration remains constant or increases after a certain threshold, the percentage of contaminant in the ion beam necessarily increases.

Figure 2:
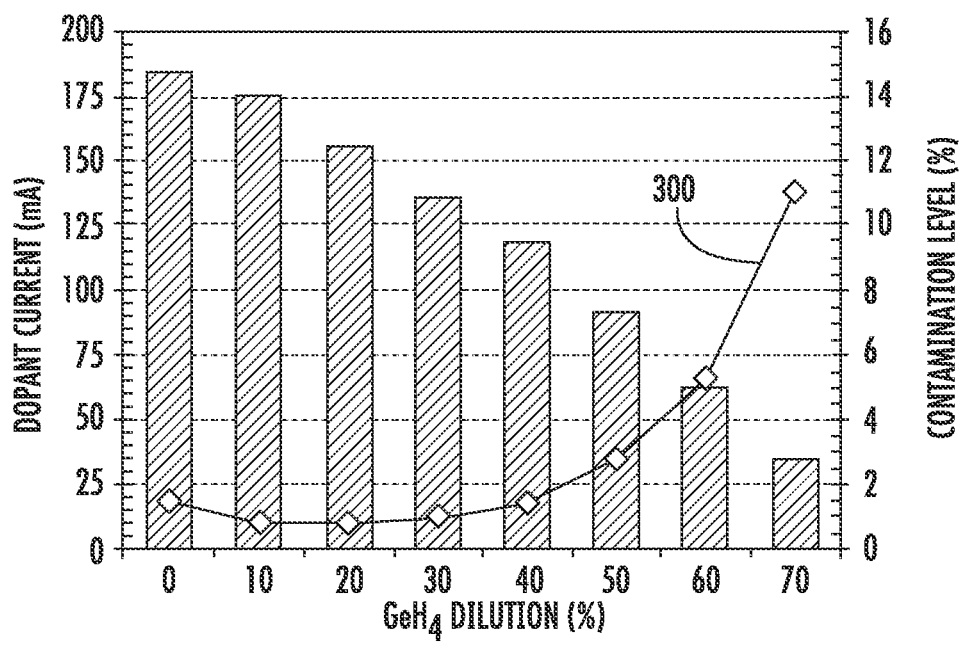
FIG. 2 is a representative graph of dopant current and contaminant level as a function of diluent gas concentration.

FIG. 2 shows a representative graph, showing the effects of diluent gas concentration on both dopant beam current and the percentage of contaminant as compared to dopant in the ion beam. As described above, the contaminant may be an ion species containing silicon, oxygen, hydrogen, aluminum, carbon, carbon-based compounds, fluorine, fluorine-based compounds, or other non-dopant species.

As can be seen in FIG. 2, the dopant current, which is represented by the bar graph, is greatest when no diluent is present. There is a nearly linear reduction in dopant current as the concentration of diluent gas, which in this example is $GeH_4$, is increased. Although this graph shows a particular relationship between dopant current and diluent concentration, it is noted that this relationship may be specific to the test conditions used. For example, a different diluent gas, a different RF power level, or a different pressure (or flow rate) inside the plasma chamber may create different results. Thus, this bar graph is intended to represent a general trend between dopant current and diluent concentration.

Line 300 shows a measure of beam impurity, defined as the percentage of contaminant compared to dopant in the ion beam, where the contaminant may be one or more of the species identified above. As expected, the beam impurity decreases as the diluent concentration is increased from 0% to 10%. As stated above, this may be due to the coating action of the hydrogen in the diluent gas. It may be possible that the other species in the diluent gas may affect the coating action. For example, in the case of $GeH_4$, hydrogen molecules are light, therefore may pumped out quickly. However, $GeH_4$ is a heavy molecule with hydrogen attached, therefore may have long transit time and high possibility to react with chamber surfaces and coat these surfaces.

However, unexpectedly, the beam impurity stays relatively flat until the diluent concentration reaches about 30%. In other words, despite the introduction of more diluent gas, the amount of the contaminant relative to the amount of dopant remains relatively constant. Throughout the range from about 5% to 30%, the beam impurity is less than about 1%. Surprisingly, if the diluent concentration is increased beyond about 30%, the beam impurity increases rather dramatically, reaching levels in excess of 5% if the gas mixture is 60% diluent gas. Beam impurity may be minimized when the concentration of diluent gas is between 5% and 30%.

FIGS. 1A-1C utilize an ion source having a RF antenna 120 and an RF power supply to generate the necessary ions. However, it can be appreciated that other ion sources may be used. For example, an indirectly heated cathode (IHC) which uses heat to cause thermionic emission of electrons may also be used in some embodiments. Other ion sources are also within the scope of the disclosure.

Thus, an extracted ion beam 180 having reduced beam impurity can be created by using two source gasses. The first source gas, or feedgas, may be a species than contains both boron and fluorine, such as $BF_3$ or $B_2F_4$. The second source gas, or diluent, may be a species that contains hydrogen and either silicon or germanium, such as silane ($SiH_4$) or germane ($GeH_4$). These two source gasses are introduced into a chamber 105 of an ion source 100, either simultaneously or sequentially, where they are ionized. The ion source may use RF energy generated by RF antenna 120. In another embodiment, the ion source may utilize the thermionic emission of electrons using an IHC. Other methods of ionizing a gas may also be used by the ion source. These two source gasses may be introduced such that between 5%-30% of the total gas (by volume) is diluent gas, while the remainder is feedgas. Ions from both source gasses are extracted through aperture 140 through use of electrodes 130, 150 and accelerated toward a workpiece 160, where they are implanted into the workpiece 160. As described earlier, these ions may not be mass analyzed, meaning that all extracted ions are implanted into the workpiece 160.

In another example, the diluent gas may include a dopant having the opposite conductivity. For example, the first source gas, or feedgas, may be a species than contains both boron and fluorine, such as $BF_3$ or $B_2F_4$. The second source gas, or diluent, may be a species that contains hydrogen and a Group V element, such as phosphorus, nitrogen or arsenic.

The above disclosure discusses diluent ranges between about 5%-30% of the total volume of gas. However, in some embodiments, this range may different. For example, in some embodiments, the diluent concentration may be up to 10%, such as 1-10%, 2-10%, 3-10% or 5-10%. In another embodiment, the diluent concentration may be up to 15%, such as 1-15%, 2-15%, 3-15%, 5-15%, or 7-15%. In another embodiment, the diluent concentration may be up to 20%, such as 2-20%, 3-20%, 5-20%, 7-20%, or 10-20%. In another embodiment, the diluent concentration may be up to 30%, such as 3-30%, 5-30%, 7-30%, 10-30% or 15-30%. In another embodiment, the diluent concentration may be up to 40%, such as 3-40%, 5-40%, 7-40%, 10-40%, 15-40% or 20-40%. In another embodiment, the diluent concentration may be up to 50%, such as 5-50%, 7-50%, 10-50%, 15-50%, 20-50%, or 25-50%. Finally, in another embodiment, the diluent concentration may be as high as 60%, such as 5-60%, 7-60%, 10-60%, 15-60%, 20-60%, 25-60% or 30-60%.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting boron into a workpiece, comprising:

introducing a feedgas and a diluent gas into a chamber of an ion source, said feedgas comprising molecules containing boron and fluorine, said diluent gas comprising molecules containing hydrogen and germanium, where between 10% and 20% of a total volume of gas introduced comprises diluent gas and a remainder of the total volume of gas introduced is the feedgas;

ionizing said feedgas and said diluent gas in said chamber; and extracting ions from said chamber and accelerating said ions toward said workpiece, wherein said extracted ions are not mass analyzed before implanting into said workpiece and wherein germanium coats walls of the chamber.

2. The method of claim 1, wherein said feedgas comprises $BF_3$.

3. The method of claim 1, wherein said feedgas comprises $B_2F_4$.

4. A method of implanting boron into a workpiece, comprising:

introducing a feedgas and a diluent gas into a chamber of an ion source, said feedgas comprising molecules containing boron and fluorine, said diluent gas comprising germane, where a predetermined amount of a total volume of gas introduced comprises diluent gas and a remainder of the total volume of gas introduced is the feedgas;

ionizing said feedgas and said diluent gas in said chamber; and extracting ions from said chamber as an ion beam and accelerating said ions toward said workpiece, wherein said extracted ions are not mass analyzed before implanting into said workpiece, wherein the predetermined amount, which is between 5% and 30%, is selected so as to reduce an amount of contaminants in the ion beam as compared to an amount of contaminants present when no diluent gas is used.

5. The method of claim 4, wherein said feedgas comprises $BF_3$.

6. The method of claim 4, wherein said feedgas comprises $B_2F_4$.

7. The method of claim 4, wherein the predetermined amount is between 10% and 20%.

8. A method of implanting boron into a workpiece, comprising:

introducing a feedgas and a diluent gas into a chamber of an ion source, said ion source comprising an RF antenna disposed outside said chamber, and a dielectric window disposed between the RF antenna and an interior of said chamber, wherein said feedgas comprises molecules containing boron and fluorine, said diluent gas comprising molecules containing hydrogen and germanium, where a predetermined amount of a total volume of gas introduced comprises diluent gas and a remainder of the total volume of gas introduced is the feedgas, wherein the predetermined amount is between 5% and 30%;

ionizing said feedgas and said diluent gas in said chamber, wherein germanium coats said dielectric window; and extracting ions from said chamber and accelerating said ions toward said workpiece, wherein said extracted ions are not mass analyzed before implanting into said workpiece, wherein said germanium reduces an amount of contaminants originating from the dielectric window that are in an extracted ion beam.

9. The method of claim 8, wherein said feedgas comprises $BF_3$.

10. The method of claim 8, wherein said feedgas comprises $B_2F_4$.

11. The method of claim 8, wherein the predetermined amount is between 10% and 20%.

* * * * *